United States Patent
Liu et al.

(10) Patent No.: US 11,916,669 B2
(45) Date of Patent: *Feb. 27, 2024

(54) CODING CONTROL METHOD AND APPARATUS IN A PASSIVE OPTICAL NETWORK, COMMUNICATION DEVICE AND STORAGE MEDIUM

(71) Applicant: ZTE CORPORATION, Guangdong (CN)

(72) Inventors: Zheng Liu, Guangdong (CN); Liuming Lu, Guangdong (CN); Yong Guo, Guangdong (CN); Xingang Huang, Guangdong (CN); Weiliang Zhang, Guangdong (CN); Liquan Yuan, Guangdong (CN)

(73) Assignee: ZTE CORPORATION (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/956,169

(22) Filed: Sep. 29, 2022

(65) Prior Publication Data

US 2023/0090550 A1 Mar. 23, 2023

Related U.S. Application Data

(63) Continuation of application No. 16/964,395, filed as application No. PCT/CN2019/072656 on Jan. 22, 2019, now Pat. No. 11,469,853.

(30) Foreign Application Priority Data

Jan. 25, 2018 (CN) .......................... 201810072184.0

(51) Int. Cl.
*H04L 1/00* (2006.01)
*H03M 13/11* (2006.01)
(Continued)

(52) U.S. Cl.
CPC ....... *H04L 1/0061* (2013.01); *H03M 13/1102* (2013.01); *H03M 13/1515* (2013.01); *H04L 1/0014* (2013.01); *H04Q 11/0067* (2013.01)

(58) Field of Classification Search
None
See application file for complete search history.

(56) References Cited

U.S. PATENT DOCUMENTS

2009/0199065 A1 8/2009 Djordjevic et al.
2011/0264983 A1 10/2011 Yoshida et al.
(Continued)

FOREIGN PATENT DOCUMENTS

CN 102118237 7/2011
CN 102325375 1/2012
(Continued)

OTHER PUBLICATIONS

C.-C. Yang, "Code Space Enlargement for Hybrid Fiber Radio and Baseband OCDMA PONs," in Journal of Lightwave Technology, vol. 29, No. 9, pp. 1394-1400, May 1, 2011, doi: 10.1109/JLT.2011.2132694. (Year: 2011).*

(Continued)

*Primary Examiner* — Daniel F. McMahon
(74) *Attorney, Agent, or Firm* — McDonald Hopkins LLC

(57) ABSTRACT

Provided is a coding control method in a passive optical network (PON). The method includes acquiring data of a service to be coded and a preset codeword length N corresponding to the service to be coded; acquiring a coding mode corresponding to the preset codeword length N in a preset table describing a correspondence between codeword length ranges and coding modes; and coding data of the service by using the coding mode corresponding to the (Continued)

preset codeword length N. Further provided are a coding control apparatus in a PON, a communication device and a storage medium.

20 Claims, 2 Drawing Sheets

(51) Int. Cl.
*H03M 13/15* (2006.01)
*H04Q 11/00* (2006.01)

(56) References Cited

U.S. PATENT DOCUMENTS

| | | | | |
|---|---|---|---|---|
| 2014/0337682 | A1* | 11/2014 | Prodan | H03M 13/618 |
| | | | | 714/755 |
| 2016/0013811 | A1* | 1/2016 | Si | H03M 13/1102 |
| | | | | 714/762 |
| 2020/0244291 | A1* | 7/2020 | Zhao | H03M 13/6577 |
| 2020/0295870 | A1* | 9/2020 | Jing | H03M 13/05 |
| 2021/0119645 | A1* | 4/2021 | Shih | H03M 13/2957 |

FOREIGN PATENT DOCUMENTS

| | | |
|---|---|---|
| CN | 102780537 | 11/2012 |
| CN | 104753654 | 7/2015 |
| CN | 105122656 | 12/2015 |
| WO | 2017048111 | 3/2017 |

OTHER PUBLICATIONS

Patent Cooperation Treaty (PCT), International Search Report and Written Opinion for Application PCT/ CN2019/072656 filed on Jan. 22, 2019, dated Mar. 28, 2019, International Searching Authority, CN.

Office Action dated Feb. 10, 2021, Chinese Patent Application No. 201810072184.0.

First Search Report, Chinese Patent Application No. 2018100721840.

* cited by examiner

CODING CONTROL METHOD AND APPARATUS IN A PASSIVE OPTICAL NETWORK, COMMUNICATION DEVICE AND STORAGE MEDIUM

CROSS-REFERENCE TO RELATED APPLICATIONS

This application is a Continuation Application of U.S. patent application Ser. No. 16/964,395 filed on Jul. 23, 2020, which is a U.S. National Stage Application of International Patent Application No. PCT/CN2019/072656 filed on Jan. 22, 2019, which claims priority to Chinese patent application No. 201810072184.0 filed with the CNIPA on Jan. 25, 2018, disclosures of which are incorporated herein by reference in their entireties.

TECHNICAL FIELD

The present disclosure relates the field of communications, for example, to a coding control method and apparatus in a passive optical network (PON), a communication device and a storage medium.

BACKGROUND

In a 10 Gbit/s passive optical network (PON), for example, a 10 Gbit/s Ethernet Passive Optical Network (EPON)/Gigabit-Capable PON (GPON), both the uplink channel and the downlink channel use Reed-Solomon (RS) coding, such as an RS (255, 223) coding mode or an RS (255, 239) coding mode and have a fixed codeword length of 255 symbols. However, as a 10 Gbit/s EPON/GPON system is upgraded to a 25 Gbit/s/50 Gbit/s EPON/GPON system, new coding modes are introduced. For example, low density parity check code (LDPC) coding with a codeword length of 16 Kbits is introduced in a 50 Gbit/s EPON/GPON system. Of course, other coding modes may be introduced in the future. With the enrichment of coding modes and the advantages and disadvantages of various coding modes, which coding mode is selected in what condition becomes significantly important. Therefore, it is urgent to provide a reliable and accurate coding mode selection mechanism to satisfy the coding requirements of different services.

SUMMARY

The present disclosure provides a coding control method and apparatus in a PON, a communication device and a storage medium to reliably and accurately select a coding mode for one or more services to satisfy coding requirements of these services.

In the present disclosure, a coding control method in a passive optical network is provided. The method includes steps described below.

A codeword length N corresponding to a service to be coded is acquired.

A coding mode corresponding to the codeword length N is matched in a preset correspondence table between codeword length ranges and coding modes.

Data of the service is coded by using the matched coding mode.

In the present disclosure, a coding control apparatus in a passive optical network is provided. The apparatus includes an information acquisition module, a matching module and a control module.

The information acquisition module is configured to acquire a codeword length N corresponding to a service to be coded.

The matching module is configured to match, in a preset correspondence table between codeword length ranges and coding modes, a coding mode corresponding to the codeword length N.

The control module is configured to code data of the service by using the coding mode matched by the matching module.

In the present disclosure, a passive optical network communication device is provided. The communication device includes a processor, a memory and a communication bus.

The communication bus is configured to implement a connection communication between the processor and the memory.

The processor is configured to execute one or more programs stored in the memory to perform the preceding method.

In the present disclosure, a computer-readable storage medium is provided. The computer-readable storage medium is configured to store one or more programs executable by one or more processors to perform the preceding method.

DETAILED DESCRIPTION

The embodiments of the present disclosure will be described in detail through implementations in conjunction with the drawings. The embodiments described herein are intended to explain and not to limit the present disclosure.

Embodiment One

Figure 1:
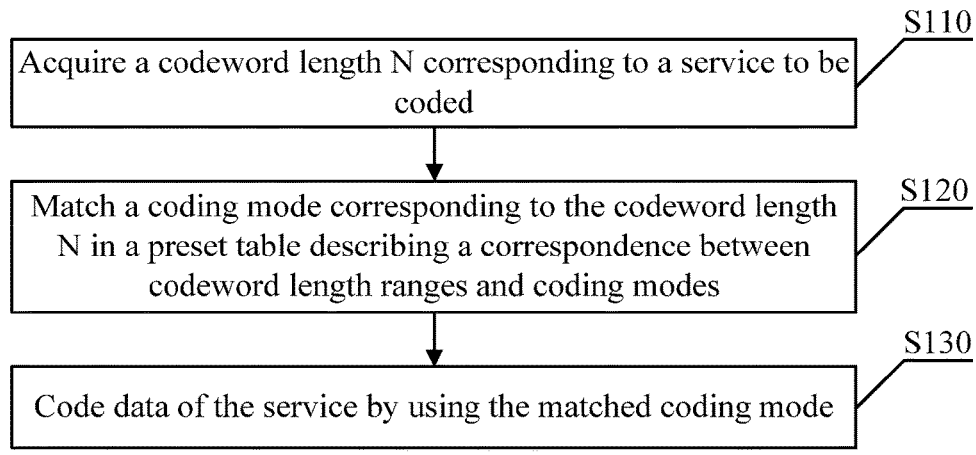
FIG. 1 is a flowchart of a coding control method in a passive optical network according to an embodiment one of the present disclosure.

To reliably and accurately select a coding mode for one or more services to satisfy the coding requirements of the services, this embodiment provides a coding control method in a passive optical network. As described in FIG. 1, the method includes steps S110 to S130.

In S110, a codeword length N corresponding to a service to be coded is acquired.

In this embodiment, the codeword length N of the service is generally defined in the corresponding communication protocol according to characteristics of the service, so the codeword length N corresponding to one or more services may be acquired in the corresponding communication protocol. Of course, the codeword length corresponding to the service may be directly determined according to characteristics of one or more services, or determined by using any other manner that may achieve the codeword length N corresponding to the service.

In an embodiment, the codeword length N corresponding to the service may be characterized by bits, or by the number of symbols and, of course, may be characterized by symbols.

For example, when the codeword length N is characterized by the number of symbols, $N=2^n-1$, where n denotes the number of bits (the number of information bits) represented by the number of symbols, and the value of n may be, for example, 5, 6, 7 or 8. For example, when n=8, the codeword length N is equal to 255 symbols; and when n=7, the codeword length N is equal to 127 symbols.

As another example, when the codeword length N is characterized by the number of bits, $N=(2^n-1)*n$, where n still denotes the number of bits (the number of information bits) represented by the number of symbols, and the value of n may be, for example, 3, 4, 5, 6, 7 or 8. For example, when n=8, the codeword length N is equal to 2040 bits; when n=7, the codeword length N is equal to 889 bits; and so forth.

For example, when the codeword length N is characterized by binary symbols, since information amount of one binary symbol is 1 bit, therefore, when the codeword length is 2040 bits, the codeword length of 2040 bits may be converted into a codeword length of 2040 binary symbols. In an embodiment, corresponding conversion is performed when symbols such as octal symbols and hexadecimal symbols are used.

In this embodiment, it may flexibly choose to characterize the codeword length N by bits or by the number of symbols, and bits and the number of symbols may be flexibly converted through the above-mentioned relationship. In this embodiment, the codeword length N is characterized by bits. In this case, the codeword length N is N bits.

In S120, according to the acquired codeword length N, a coding mode corresponding to the codeword length N is matched in a preset correspondence table between codeword length ranges and coding modes.

In this embodiment, the correspondence table between the codeword length ranges and the coding modes may be preset, the coding modes included in the correspondence table and a codeword length range corresponding to each coding mode included in the correspondence table may be flexibly set, moreover, one coding mode may correspond to one or more codeword length ranges.

For example, in an example, as described in table 1 below, the correspondence table between the codeword length ranges and the coding modes includes a first coding mode and a second coding mode. The first coding mode corresponds to a first codeword length range, and the second coding mode corresponds to a second codeword length range.

TABLE 1

| Coding Mode | Codeword Length Range |
| --- | --- |
| First coding mode | First codeword length range |
| Second coding mode | Second codeword length range |

As another example, in an example, as described in table 2 below, the correspondence table between the codeword length ranges and the coding modes includes a first coding mode, a second coding mode and a third coding mode. The first coding mode corresponds to a first codeword length range, the second coding mode corresponds to a second codeword length range, and the third coding mode corresponds to a third codeword length range and a fourth codeword length range. There is no intersection between the third codeword length range and the fourth codeword length range.

TABLE 2

| Coding Mode | Codeword Length Range |
| --- | --- |
| First coding mode | First codeword length range |
| Second coding mode | Second codeword length range |
| Third coding mode | Third codeword length range |
|  | Fourth codeword length range |

It may be seen that the coding modes and one or more codeword length ranges corresponding to each coding mode included in the correspondence table between the codeword length ranges and the coding modes may be flexibly set, and may be set by a service provider, a network provider or other parties. The codeword length ranges corresponding to each coding mode may be flexibly set according to factors such as characteristics of the coding mode or requirements of one or more services, etc. Moreover, there may be no intersection or a partial intersection among codeword length ranges corresponding to different coding modes. When there is an intersection and the codeword length of a service is within this intersection range, any one of multiple coding modes corresponding to the intersection range may be selected or any one of the multiple coding modes corresponding to the intersection range may be reselected by using other selection mechanisms, which include, but are not limited to, reselection according to, for example, characteristics, such as the popularity, priority, etc. of the coding modes.

In S130, data of the service is coded by using the matched coding mode.

After the coding mode is selected for the service through step S120, the data (including, but not limited to, one or more types of service data) related to the service is coded by using the selected coding mode.

The coding control method in the passive optical network according to this embodiment is applicable to one or more communication devices, including, but not limited to, an optical line terminal (OLT) or an optical network unit (ONU), in the passive optical network. Moreover, the coding control method according to this embodiment is not only applicable to the passive optical network, but also applicable to other types of communication networks.

In the coding control method in the passive optical network according to this embodiment, a coding mode suitable for one or more services may be matched according to codeword lengths corresponding to the one or more services and codeword length ranges corresponding to the one or more coding modes. Moreover, this matching process may be automatic matching (of course, the matching process may be configured to be non-automatic according to actual requirements), so that issues of a service such as relatively large delays or poor capabilities of correcting errors caused by selecting a wrong coding mode are avoided.

Embodiment Two

To facilitate understanding, based on the preceding embodiment, the description of this embodiment takes the correspondence table between codeword length ranges and coding modes including RS coding and low density parity check code coding (LDPC coding) as an example.

Figure 2:
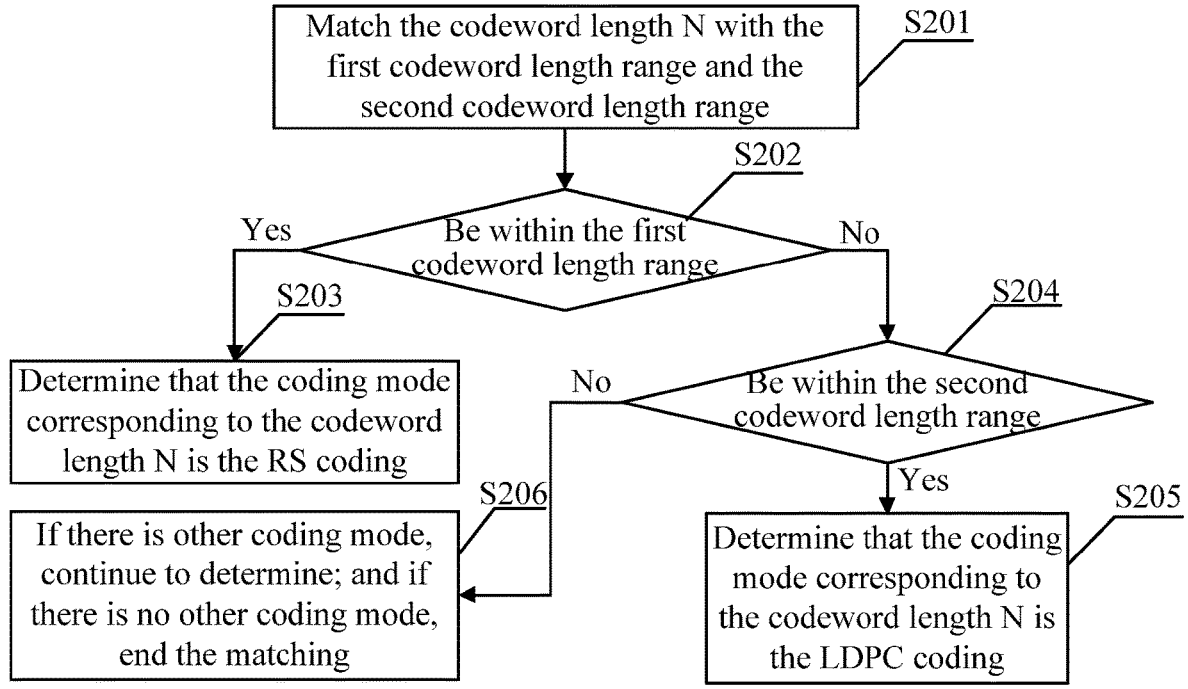
FIG. 2 is a flowchart of matching a coding mode according to a codeword length according to an embodiment two of the present disclosure.

In this embodiment, the RS coding and the LDPC coding may each correspond to only one codeword length range respectively. For example, as described in table 3, the RS coding corresponds to a first codeword length range and the LDPC coding corresponds to a second codeword length range. In this case, the step in which according to the acquired codeword length N corresponding to the service, the coding mode corresponding to the codeword length N is matched in the preset correspondence table between the codeword length ranges and the coding modes includes steps S201 to S206 as described in FIG. 2.

In S201, the codeword length N is matched with the first codeword length range and the second codeword length range.

In S202, it is determined whether the codeword length is within the first codeword length range. If the codeword length is within the first codeword length range, step S203 is executed; and if the codeword length is not within the first codeword length range, step S204 is executed.

In S203, it is determined that the coding mode corresponding to the codeword length N is the RS coding.

In S204, it is determined whether the codeword length is within the second codeword length range. If the codeword length is within the second codeword length range, step S205 is executed; and if the codeword length is not within the second codeword length range, step S206 is executed.

In S205, it is determined that the coding mode corresponding to the codeword length N is the LDPC coding.

In S206, if there is other coding mode, the determination continues; and if there is no other coding mode, the matching ends.

In this embodiment, if the final matching fails, an alarm may be initiated, or a coding mode is selected according to a preset rule, such as directly selecting the LDPC coding or the RS coding.

In an embodiment, the execution order of steps S202 and S204 may be flexibly configured, and the steps S202 and S204 may be executed in parallel at the same time or in a serial manner.

TABLE 3

| Coding Mode | Codeword Length Range |
|---|---|
| RS coding | First codeword length range |
| LDPC coding | Second codeword length range |

In this embodiment, the first codeword length range corresponding to the RS coding and the second codeword length range corresponding to the LDPC coding may be continuous or discontinuous. For example, as described in table 4, the first codeword length range is a range in which a codeword length is less than or equal to a preset codeword length threshold X and the second codeword length range is a range in which a codeword length is greater than the preset codeword length threshold X, where the codeword length threshold X is the number of bits.

TABLE 4

| Coding Mode | Codeword Length Range |
|---|---|
| RS coding | Less than or equal to X |
| LDPC coding | Greater than X |

In this embodiment, the value of the codeword length threshold X may be greater than or equal to 128 bits and less than or equal to 2048 bits, such as 155 bits, 378 bits, 889 bits, 2049 bits, etc. Of course, the codeword length threshold X may be set by using the expression of $(2^n-1)*n$. In this case, 155 bits are characterized by $(2^5-1)*5=31$ symbols, 378 bits are characterized by $(2^n-1)*6=63$ symbols, 889 bits are characterized by $(2^7-1)*7=127$ symbols, and 2040 bits are characterized by $(2^8-1)*8=255$ symbols. Of course, in this embodiment, the codeword length threshold X may be configured according to the practical application scenarios to have other value ranges, and the codeword length threshold X is not limited to a value greater than or equal to 128 bits and less than or equal to 2048 bits in the preceding example.

In this embodiment, the codeword length threshold X may be directly set to one bit of data. For example, $128 \leq X \leq 2048$. That is, X may be any value from 128 to 2048 according to an application scenario. For example, in a case where X is 2048, when the codeword length N corresponding to the acquired service is less than or equal to 2048 bits, the RS coding is determined to be used; and when the codeword length N corresponding to the acquired service is greater than 2048 bits, the LDPC coding is determined to be used. For example, in a case where X is 128, when the codeword length N corresponding to the acquired service is less than or equal to 128 bits, the RS coding is determined to be used; and when the codeword length N corresponding to the acquired service is greater than 128 bits, the LDPC coding is determined to be used. As another example, in a case where X is 1024, when the codeword length N corresponding to the acquired service is less than or equal to 1024 bits, the RS coding is determined to be used; and when the codeword length N corresponding to the acquired service is greater than 1024 bits, the LDPC coding is determined to be used.

As another example shown in table 5, the first codeword length range is a range in which a codeword length is greater than or equal to a preset codeword length threshold X1 and less than or equal to a preset codeword length threshold X2, and the second codeword length range is a range in which a codeword length is greater than or equal to a preset codeword length threshold X3 and less than or equal to a preset codeword length threshold X4, where X1 is less than X2, X3 is greater than X2, and X4 is greater than X3.

TABLE 5

| Coding Mode | Codeword Length Range |
|---|---|
| RS coding | Greater than or equal to X1 and less than or equal to X2 |
| LDPC coding | Greater than or equal to X3 and less than or equal to X4 |

At least one of the RS coding and the LDPC coding corresponds to more than two codeword length ranges. For example, as shown in table 6, the first codeword length range is a range in which a codeword length is greater than or equal to a preset codeword length threshold X1 and less than or equal to a preset codeword length threshold X2, and the second codeword length range is a range in which a codeword length is greater than or equal to a preset codeword length threshold X3, less than or equal to a preset codeword length threshold X4, greater than or equal to a preset codeword length threshold X5 and less than or equal to a preset codeword length threshold X6, where X1 is less than X2, X3 is greater than X2, X4 is greater than X3, X5 is greater than X4 and X6 is greater than X5.

TABLE 6

| Coding Mode | Codeword Length Range |
|---|---|
| RS coding | Greater than or equal to X1 and less than or equal to X2 |
| LDPC coding | Greater than or equal to X3 and less than or equal to X4 |
| | Greater than or equal to X5 and less than or equal to X6 |

The preceding codeword length ranges corresponding to the RS coding and the LDPC coding are merely exemplary and may be flexibly set according to practical application scenarios and coding modes. Moreover, for the characterization manner of the values of X1, X2, X3, X4, X5 and X6, see the preceding characterization manner of X.

In this embodiment, after the corresponding coding mode is determined according to the codeword length corresponding to the service and before the data of the service is coded by using the determined coding mode, the method may further include a step described below. A coding parameter of the matched coding mode is determined. Moreover, the coding parameter in this embodiment includes the number of bits included in one codeword after coding (of course, the number of bits may be converted into the number of symbols n for characterization) and the number of information bits before the coding (of course, the number of information bits may be converted into the number of symbols n for characterization).

In an example, the number of bits included in one codeword of one or more coding modes after the coding and the number of information bits of the one or more coding modes before the coding may be preset, for example, one fixed value may be preset for each. However, in this embodiment, the codeword length N corresponding to the service may be set in a dynamic and flexible manner to better satisfy requirements of one or more services. For example, in this embodiment, the step in which the number of bits included in one codeword after the RS coding and the LDPC coding is determined includes serving the codeword length N corresponding to the service as the number of bits included in one codeword after the coding. In this case, when the codeword length N corresponding to the service is equal to 2040, if the RS coding is matched, the number of bits included in one codeword after the RS coding is 2040 (converted into 255 symbols); and if the LDPC coding is matched, the number of bits included in one codeword after the LDPC coding is also 2040 (converted into 255 symbols).

In this embodiment, the manner of determining the number of information bits before the coding may be set according to rules described below.

When the matched coding mode is the RS coding, the step in which the number of information bits before the RS coding is determined includes a step described below. The number of information bits before the coding is determined to be an integer less than the codeword length N and greater than 0. For example, when the codeword length N corresponding to the service is equal to 2040, the number of bits included in one codeword after the RS coding is 2040 (converted into 255 symbols) and the number of information bits before the coding may be 1784 (converted into 223 symbols) or 1912 (converted into 239 symbols).

When the matched coding mode is the LDPC coding, the step in which the number of information bits before the coding is determined includes a step described below. The number of information bits before the coding is determined to be an integer greater than the codeword length N multiplied by 0.8 and less than the codeword length N multiplied by 0.93. For example, it is assumed that the number of information bits before the coding is k, and k has a value range of $0.8*N<k<0.93*N$.

It may be seen that in this embodiment, on one hand, the coding mode corresponding to one or more services can be matched according to codeword lengths corresponding to the one or more services; on the other hand, the coding parameter corresponding to the coding mode can be set according to the codeword length N corresponding to the one or more services. In this manner, the requirements of the one or more services can be more accurately satisfied.

Embodiment Three

Figure 3:
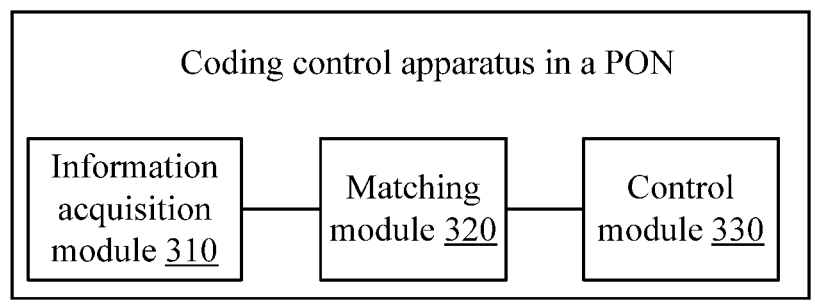
FIG. 3 is a structure diagram of a coding control apparatus in a passive optical network according to an embodiment three of the present disclosure.

This embodiment further provides a coding control apparatus in a passive optical network. The coding control apparatus may be disposed in one or more passive optical network communication devices which will perform coding. For example, one or more passive optical network communication devices include, but are not limited to, OLTs or ONUs. Moreover, the function of the modules included in the coding control apparatus may be implemented by processors or controllers of these communication devices. As described in FIG. 3, the coding control apparatus includes an information acquisition module 310, a matching module 320 and a control module 330.

The information acquisition module 310 is configured to acquire a codeword length N corresponding to a service to be coded. In this embodiment, the codeword length N of the service is generally defined in the corresponding communication protocol according to the characteristics of the service, so the information acquisition module 310 may acquire the codeword length N corresponding to one or more services in the corresponding communication protocol. Of course, the information acquisition module 310 may directly determine the codeword length corresponding to the service according to characteristics of one or more services, or by using any other manner that can achieve the codeword length N corresponding to the service. Moreover, in this embodiment, the codeword length N corresponding to the service may be characterized by bits or by the number of symbols.

The matching module 320 is configured to match a coding mode corresponding to the codeword length N in a preset correspondence table between codeword length ranges and coding modes according to the codeword length N acquired by the information acquisition module 310. In this embodiment, the correspondence table between the codeword length ranges and the coding modes may be preset. The correspondence table includes at least two coding modes, each coding mode corresponds to at least one codeword length range, and the coding modes and the at least one codeword length range corresponding to each coding mode included in the correspondence table may be flexibly set. Further, one coding mode may correspond to one or more codeword length ranges.

The control module 330 is configured to code data of the service by using the coding mode matched by the matching module 320.

To facilitate understanding, based on the preceding embodiment, the description of this embodiment is given still by taking the correspondence table between the codeword length ranges and the coding modes including the RS coding and the LDPC coding as an example. In this embodiment, the RS coding and the LDPC coding may each correspond to only one codeword length range; the codeword length range of the RS coding is a range in which a codeword length is less than or equal to a preset codeword length threshold X, and the codeword length range of the LDPC coding is a range in which a codeword length is greater than the preset codeword length threshold X, where the codeword length threshold X is the number of bits.

In this example, X may be characterized by the expression $X=(2^n-1)*n$; in this case, the codeword length of $(2^n-1)*n$ bits is used as a boundary condition for a selection between the RS coding and the LDPC coding. When the codeword length N corresponding to the service is less than or equal to X, the RS coding is used; and when N is greater than X, the LDPC coding is used, where n is a natural number other than 0.

For example, when n=8 and the codeword length N corresponding to the service is equal to 2040 bits (that is, 255 symbols), the RS coding may be used, and the RS(255, 223) coding mode or the RS(255, 239) coding mode may be multiplexed, where 255 is the number of symbols included in one codeword after the coding, 223 is the number of information bits before the coding, 255 symbols and 223 information bits are converted into 2040 bits and 1784 bits respectively; and 239 is converted into 1912 as the number of information bits correspondingly. In an embodiment, whether to use the number of symbols or the number of bits for characterization may be flexibly set.

Likewise, when n=7, the codeword length N corresponding to the service is equal to 889 bits (that is, 127 symbols), the RS coding such as RS(127, 111) coding mode may be used.

When n=6, the codeword length N corresponding to the service is equal to 378 bits (that is, 63 symbols), the RS coding such as RS(63, 55) coding mode may be used.

When n=5, the codeword length N corresponding to the service is equal to 155 bits (that is, 31 symbols), the RS coding such as RS(31, 27) coding mode may be used.

The preceding example is exemplarily described by using the characterization mode of the number of symbols and X may be directly characterized by the number of bits. For example, the codeword length of 128≤X≤2048 bits may be configured to be the boundary condition for the selection between the RS coding and the LDPC coding. In this case, the threshold X may be any value from 128 to 2048. In an embodiment, the value range of the threshold X may be flexibly set. For example, the value range of the threshold X may be set to any integer in a range of $0.9*1K \leq X \leq 1.1*32K$, where 1K is equal to 1024 bits, 2K is equal to 2048 bits, and so on. In an example, the threshold X is set to be equal to $0.9*1K$ and the codeword length N corresponding to the service is greater than $0.9*1K$. In this case, the LDPC coding is selected and the rule for setting the coding parameter of the LDPC coding may be described below.

When $0.9*1K \leq N \leq 1.1*1K$, the LDPC(N, k) coding mode is used, where $0.8*N < k < 0.93*N$.

When $0.9*2K \leq N \leq 1.1*2K$, the LDPC(N, k) coding mode is used, where $0.8*N < k < 0.93*N$.

When $0.9*4K \leq N \leq 1.1*4K$, the LDPC(N, k) coding mode is used, where $0.8*N < k < 0.93*N$.

When $0.9*8K \leq N \leq 1.1*8K$, the LDPC(N, k) coding mode is used, where $0.8*N < k < 0.93*N$.

When $0.9*16K \leq N \leq 1.1*16K$, the LDPC(N, k) coding mode is used, where $0.8*N < k < 0.93*N$.

When $0.9*32K \leq N \leq 1.1*32K$, the LDPC(N, k) coding mode is used, where $0.8*N < k < 0.93*N$.

N is not only the codeword length corresponding to the service, but also the number of bits included in one codeword after the LDPC coding, that is, the number of bits included in one codeword after the coding is equal to the codeword length corresponding to the service; and k is the number of information bits before the LDPC coding.

It may be seen that in this embodiment, when the codeword length corresponding to the service is relatively small, coding may be performed by using the LDPC coding mode of small code blocks, so that the algorithm complexity and the processing delay can be reduced; and when the codeword length corresponding to the service is relatively great, the coding may be performed by using the LDPC coding mode of large code blocks, so that coding gains can be increased.

Embodiment Four

Figure 4:
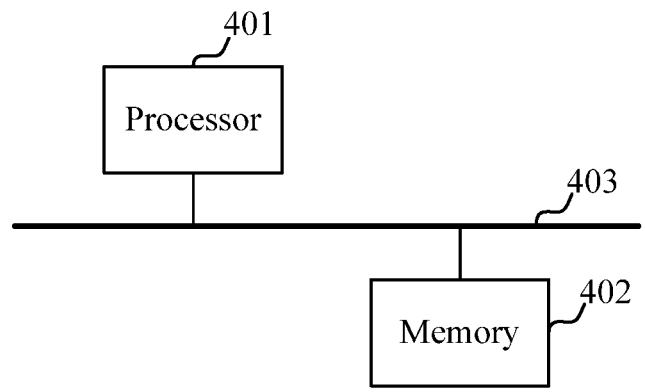
FIG. 4 is a structure diagram of a passive optical network communication device according to an embodiment four of the present disclosure.

This embodiment provides a passive optical network communication device, the device may be any communication device such as an OLT or an ONU which needs to perform coding in the passive optical network. As described in FIG. 4, the passive optical network communication device in this embodiment includes a processor 401, a memory 402 and a communication bus 403.

The communication bus 403 is configured to implement a connection communication between the processor 401 and the memory 402.

The processor 401 is configured to execute one or more programs stored in the memory 402 to perform the preceding method.

This embodiment further provides a computer-readable storage medium, which may be used in one or more electronic communication devices. For example, the electronic communication devices include, but are not limited to, OLTs or ONUs. The computer-readable storage medium stores one or more programs executable by one or more processors, so that the method in the preceding embodiments is performed.

To facilitate understanding, based on the preceding embodiment, the description of this embodiment is still given by taking the correspondence table between the codeword length ranges and the coding modes including the RS coding and the LDPC coding as an example. In this embodiment, the RS coding and the LDPC coding may each correspond to only one codeword length range; the codeword length range of the RS coding is a range in which a codeword length is less than or equal to a preset codeword length threshold X and the codeword length range of the LDPC coding is a range in which a codeword length is greater than the preset codeword length threshold X, where the codeword length threshold X is the number of bits. Explanation and description are performed by using several examples below.

Example One

In this example, X may be characterized by the expression $X=(2^n-1)*n$; in this case, a codeword length of $(2^n-1)*n$ bits is used as a boundary condition for a selection between the RS coding and the LDPC coding. When the codeword length N corresponding to the service is less than or equal to X, the RS coding is used; and when N is greater than X, the LDPC coding is used, where n is a natural number other than 0.

In an example, when n=8, the codeword length N corresponding to the service is equal to 2040 bits (that is, 255 symbols), the RS coding may multiplex the RS(255, 223) coding mode or the RS(255, 239) coding mode.

In an example, X is characterized by the number of bits, and for example, it is configured that X=1K=1024 bits and the codeword length N corresponding to the service is greater than 1K. In this case, when $0.9*2K \leq N \leq 1.1*2K$, the LDPC(N, k) coding mode is used, where $0.8*N < k < 0.93*N$, at this time, the LDPC coding delay may be controlled within 2 us.

When $0.9*4K \leq N \leq 1.1*4K$, the LDPC(N, k) coding mode is used, where $0.8*N < k < 0.93*N$. In this case, the LDPC coding delay may be controlled within 4 us.

When 0.9*8K≤N≤1.1*8K, the LDPC(N, k) coding mode is used, where 0.8*N<k<0.93*N. In this case, the LDPC coding delay may be controlled within 6 us.

When 0.9*16K≤N≤1.1*16K, the LDPC (N, k) coding mode is used, where 0.8*N<k<0.93*N. In this case, the LDPC coding delay may be controlled within 12 us.

When 0.9*32K≤N≤1.1*32K, the LDPC (N, k) coding mode is used, where 0.8*N<k<0.93*N. In this case, the LDPC coding delay may be controlled within 20 us.

Example Two

The threshold is directly characterized by the number of bits and the threshold X has a value range of 128≤X≤2048; when the codeword length N corresponding to the service is less than or equal to X, the RS coding is used; and when the codeword length N corresponding to the service is greater than X, the LDPC coding is used. According to this selection condition, it may switch to the LDPC coding when the codeword length is smaller to acquire larger coding gains. In this case, it is assumed that the matched coding mode matched according to the preceding matching rule is the LDPC coding, the coding parameter may be configured in following manners.

When 0.9*1K≤N≤1.1*1K, the LDPC(N, k) coding mode is used, where 0.8*N<k<0.93*N. In this case, the LDPC coding delay may be controlled within 1 us.

When 0.9*2K≤N≤1.1*2K, the LDPC(N, k) coding mode is used, where 0.8*N<k<0.93*N. In this case, the LDPC coding delay may be controlled within 2 us.

When 0.9*4K≤N≤1.1*4K, the LDPC(N, k) coding mode is used, where 0.8*N<k<0.93*N. In this case, the LDPC coding delay may be controlled within 4 us.

When 0.9*8K≤N≤1.1*8K, the LDPC(N, k) coding mode is used, where 0.8*N<k<0.93*N. In this case, the LDPC coding delay may be controlled within 6 us.

When 0.9*16K≤N≤1.1*16K, the LDPC(N, k) coding mode is used, where 0.8*N<k<0.93*N. In this case, the LDPC coding delay may be controlled within 12 us.

When 0.9*32K≤N≤1.1*32K, the LDPC(N, k) coding mode is used, where 0.8*N<k<0.93*N. In this case, the LDPC coding delay may be controlled within 20 us.

In this case, when the codeword length is relatively small, it may switch to the LDPC coding mode of small code blocks, so that the algorithm complexity and the processing delay can be reduced; and when the codeword length is relatively large, it may switch to the LDPC coding mode of large code blocks so that the coding gains can be increased.

Example Three

In this example, X may be characterized by the expression $X=(2^n-1)*n$; in this case, a codeword length of $(2^n-1)*n$ bits is used as a boundary condition for a selection between the RS coding and the LDPC coding. When the codeword length N corresponding to the service is less than or equal to X, the RS coding is used; and when N is greater than X, the LDPC coding is used, where n is a natural number other than 0.

For example, when n=7, the codeword length N corresponding to the service is equal to 889 bits (that is, 127 symbols), the RS coding such as the RS (127, 111) coding mode may be used; in this case, the RS coding delay may be controlled within 1 s.

When n=6, the codeword length N corresponding to the service is equal to 378 bits (that is, 63 symbols), the RS coding such as the RS (63, 55) coding mode may be used; in this case, the LDPC coding delay may be controlled within 0.5 us.

When n=5, the codeword length N corresponding to the service is equal to 155 bits (that is, 31 symbols), the RS coding such as the RS (31.27) coding mode may be used; in this case, the LDPC coding delay may be controlled within 0.25 us.

According to the preceding method, when the codeword length is less than 2K bits, the upgraded 25G/50G EPON/GPON system may use a smaller RS codeword length. In this manner, the algorithm complexity and the coding processing delay can be reduced. Meanwhile, it may switch to the LDPC coding mode of small code blocks earlier, thereby increasing the coding gains compared with the related RS(255, 223).

Apparently, it is to be understood by those skilled in the art that the one or more modules or one or more steps in embodiments of the present disclosure may be implemented by one or more general-purpose computing devices and may be concentrated on a single computing device or distributed in a network formed by multiple computing devices. In an embodiment, these modules or steps may be implemented by program codes executable by the one or more computing devices. Thus, these modules or steps may be stored in a computer storage medium (a read-only memory (ROM)/random-access memory (RAM), a magnetic disk or an optical disk) and executed by the one or more computing devices. Moreover, in some cases, the illustrated or described steps may be executed in a sequence different from the sequence described herein. Alternatively, these modules or steps may be implemented by being made into one or more integrated circuit modules separately or multiple ones of these modules or steps may be implemented by being made into a single integrated circuit module. Therefore, the present disclosure is not limited to any combination of hardware and software.

What is claimed is:

1. A coding control method in a passive optical network, comprising:
   acquiring a service to be coded and a preset codeword length N corresponding to the service to be coded, wherein N is a positive integer;
   matching, in a preset correspondence table between codeword length ranges and coding modes, a coding mode corresponding to the preset codeword length N; and
   coding the service to be coded by using the coding mode corresponding to the preset codeword length N.

2. The method of claim 1, wherein
   the preset correspondence table between the codeword length ranges and the coding modes comprises at least two coding modes, each of the at least two coding modes corresponds to at least one of the codeword length ranges, and the codeword length N is N bits.

3. The method of claim 2, wherein the preset correspondence table between the codeword length ranges and the coding modes comprises Reed-Solomon (RS) coding, low density parity check code coding, a first codeword length range corresponding to the RS coding and a second codeword length range corresponding to the low density parity check code coding;
   wherein matching, in the preset correspondence table between the codeword length ranges and the coding modes, the coding mode corresponding to the codeword length N comprises:

matching the codeword length N with the first codeword length range and the second codeword length range;

in response to a matching result that the codeword length N is within the first codeword length range, determining that the coding mode corresponding to the codeword length N is the RS coding; and in response to a matching result that the codeword length N is within the second codeword length range, determining that the coding mode corresponding to the codeword length N is the low density parity check code coding.

4. The method of claim 3, wherein the first codeword length range is a range in which a codeword length is less than or equal to a preset codeword length threshold and the second codeword length range is a range in which a codeword length is greater than the preset codeword length threshold.

5. The method of claim 3, wherein after matching the coding mode corresponding to the codeword length, and before coding the service to be coded by using the coding mode corresponding to the preset codeword length N, the method further comprises:

determining a coding parameter of the coding mode corresponding to the preset codeword length N, wherein the coding parameter comprises a number of bits contained in one codeword after coding and a number of information bits before the coding.

6. The method of claim 5, wherein determining the number of bits contained in the one codeword after the coding comprises:

serving the codeword length N corresponding to the service as the number of bits contained in the one codeword after the coding.

7. The method of claim 5, wherein in a case where the coding mode corresponding to the preset codeword length N is the low density parity check code coding, determining the number of information bits before the coding comprises:

determining that the number of information bits before the coding is an integer greater than the codeword length N multiplied by 0.8 and less than the codeword length N multiplied by 0.93.

8. The method of claim 5, wherein in a case where the coding mode corresponding to the preset codeword length N is the RS coding, determining the number of information bits before the coding comprises:

determining that the number of information bits before the coding is an integer less than the codeword length N and greater than 0.

9. A passive optical network communication device, comprising a processor, a memory and a communication bus, wherein the communication bus is configured to implement a connection communication between the processor and the memory; and the processor is configured to:

acquire a service to be coded and a preset codeword length N corresponding to the service to be coded, wherein N is a positive integer;

match, in a preset correspondence table between codeword length ranges and coding modes, a coding mode corresponding to the preset codeword length N; and code the service to be coded by using the coding mode corresponding to the preset codeword length N.

10. A non-transitory computer-readable storage medium, configured to store at least one program, wherein the at least one program is executable by at least one processor to implement the method of claim 1.

11. The method of claim 4, wherein after matching the coding mode corresponding to the codeword length N, and before coding the service to be coded by using the coding mode corresponding to the preset codeword length N, the method further comprises:

determining a coding parameter of the coding mode corresponding to the preset codeword length N, wherein the coding parameter comprises a number of bits contained in one codeword after coding and a number of information bits before the coding.

12. The method of claim 6, wherein in a case where the coding mode corresponding to the preset codeword length N is the low density parity check code coding, determining the number of information bits before the coding comprises:

determining that the number of information bits before the coding is an integer greater than the codeword length N multiplied by 0.8 and less than the codeword length N multiplied by 0.93.

13. The passive optical network communication device of claim 9, wherein the preset correspondence table between the codeword length ranges and the coding modes comprises at least two coding modes, each of the at least two coding modes corresponds to at least one of the codeword length ranges, and the codeword length N is N bits.

14. The passive optical network communication device of claim 13, wherein the preset correspondence table between the codeword length ranges and the coding modes comprises Reed-Solomon (RS) coding, low density parity check code coding, a first codeword length range corresponding to the RS coding and a second codeword length range corresponding to the low density parity check code coding;

wherein processor is configured to match, in the preset correspondence table between the codeword length ranges and the coding modes, the coding mode corresponding to the codeword length N in the following manners:

matching the codeword length N with the first codeword length range and the second codeword length range;

in response to a matching result that the codeword length N is within the first codeword length range, determining that the coding mode corresponding to the codeword length N is the RS coding; and in response to a matching result that the codeword length N is within the second codeword length range, determining that the coding mode corresponding to the codeword length N is the low density parity check code coding.

15. The passive optical network communication device of claim 14, wherein the first codeword length range is a range in which a codeword length is less than or equal to a preset codeword length threshold and the second codeword length range is a range in which a codeword length is greater than the preset codeword length threshold.

16. The passive optical network communication device of claim 14, wherein the processor is further configured to:

determine a coding parameter of the coding mode corresponding to the preset codeword length N, wherein the coding parameter comprises a number of bits contained in one codeword after coding and a number of information bits before the coding.

17. The passive optical network communication device of claim 15, wherein the processor is further configured to:

determine a coding parameter of the coding mode corresponding to the preset codeword length N, wherein the coding parameter comprises a number of bits contained in one codeword after coding and a number of information bits before the coding.

18. The passive optical network communication device of claim 16, wherein the processor is configured to determine the number of bits contained in the one codeword after the coding in the following manner:
serve the codeword length N corresponding to the service as the number of bits contained in the one codeword after the coding.

19. The passive optical network communication device of claim 16, wherein in a case where the coding mode corresponding to the preset codeword length N is the low density parity check code coding, the processor is configured to determine the number of information bits before the coding in the following manner:
determining that the number of information bits before the coding is an integer greater than the codeword length N multiplied by 0.8 and less than the codeword length N multiplied by 0.93.

20. The passive optical network communication device of claim 18, wherein in a case where the coding mode corresponding to the preset codeword length N is the RS coding, the processor is configured to determine the number of information bits before the coding in the following manner:
determining that the number of information bits before the coding is an integer less than the codeword length N and greater than 0.

\* \* \* \* \*